US012771348B1

(12) United States Patent
Kumar

(10) Patent No.: US 12,771,348 B1
(45) Date of Patent: Oct. 20, 2026

(54) TRANSMITTER CIRCUIT FOR LOW POWER APPLICATION

(71) Applicant: Cadence Design Systems, Inc., San Jose, CA (US)

(72) Inventor: Vinod Kumar, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 33 days.

(21) Appl. No.: 18/941,270

(22) Filed: Nov. 8, 2024

(51) Int. Cl.
*H03K 19/003* (2006.01)
*G11C 7/10* (2006.01)
*H03K 19/017* (2006.01)

(52) U.S. Cl.
CPC ..... *H03K 19/00384* (2013.01); *G11C 7/1057* (2013.01); *H03K 19/01742* (2013.01)

(58) Field of Classification Search
CPC ........... H03K 19/003; H03K 19/00369; H03K 19/00384; H03K 19/017; H03K 19/01721; H03K 19/01742; G11C 7/10; G11C 7/1051; G11C 7/1057
See application file for complete search history.

(56) References Cited

U.S. PATENT DOCUMENTS 6,118,310 A * 9/2000 Esch, Jr. .......... H03K 19/00384 327/437
7,737,734 B1 * 6/2010 Khamesra ...... H03K 19/018521 327/108
9,344,088 B1 * 5/2016 Sanchez ......... H03K 19/018521
9,997,214 B1 * 6/2018 Kumar ................. G11C 7/1069
10,003,336 B1 * 6/2018 Wang ................ H03K 19/1776
10,566,046 B1 * 2/2020 Kumar ...................... H03K 3/57
11,082,267 B1 * 8/2021 Kumar ................ G11C 11/4093
11,874,788 B1 * 1/2024 Kumar ............... H03K 19/1776
12,212,315 B1 * 1/2025 Kumar ................... H03K 3/011
2009/0091358 A1 * 4/2009 Chauhan .......... H03K 19/00384 327/108
2014/0292390 A1 * 10/2014 Baek .................... G11C 7/1069 327/160
2018/0062651 A1 * 3/2018 Jung .............. H03K 19/017509
2025/0038738 A1 * 1/2025 Ahammed ..... H03K 19/018521
2025/0364017 A1 * 11/2025 Lee ...................... G11C 7/1048

* cited by examiner

*Primary Examiner* — Jason M Crawford
(74) *Attorney, Agent, or Firm* — Mark H. Whittenberger; Holland & Knight LLP

(57) ABSTRACT

Embodiments included herein are directed towards a circuit and method of using the same. The transmitter circuit may include a process, voltage, temperature (PVT) controlled pull-up pre-driver and a PVT controlled pull-up driver. The transmitter circuit may further include a PVT controlled pull-down pre-driver and a PVT controlled pull-down driver. The transmitter circuit may also include a thin oxide hybrid static switch operatively connected with the PVT controlled pull-up pre-driver and the PVT controlled pull-up driver. The transmitter circuit may further include a thin oxide NMOS static switch operatively connected with the PVT controlled pull-down pre-driver and the PVT controlled pull-down driver.

16 Claims, 12 Drawing Sheets

TRANSMITTER CIRCUIT FOR LOW POWER APPLICATION

FIELD OF THE INVENTION

The present disclosure relates to circuits, and more particularly, to a power, performance, and area efficient transmitter architecture.

BACKGROUND

As computing and processing technologies improve over time, there is a commiserate need for advances in memory technology as well. This is because the increase in speed of processors requires a similar increase in speed of memory components, such as DRAM (Dynamic Random Access Memory), to boost overall system performance. For example, the target speed for LPDDR4X DRAM is up to 5.4 Gbps, while the target speed for LPDDR5 DRAM is up to 9.8 Gbps and the target speed for LPDDR6 DRAM is up to 14.8 Gbps.

At the same time the target speeds of DRAM are increasing, the IO (Input/Output) interface supply (VDDQ) for DRAMs is also being reduced to reduce the dynamic power of the DRAM product. In the advance generations of DRAMs, the target VDDQ supply for DRAM products, such as for example, LPDDR4X DRAM is 0.6V to 0.4V and the target VDDQ supply for LPDDR5 and LPDDR6 DRAM is 0.5V to 0.3V.

As target speeds increase for memory technology, this leads to potential problems that arise for conventional output drivers, particularly in combination with the reduction of supply voltages for these circuits. One reason is because as the VDDQ supply may be near the threshold voltage of the output driving devices, this means that the output driver may present large variations in its drive. In addition, challenges exist for conventional output drivers associated with ensuring the linearity of the output driver impedance with respect to the output voltage. To address these problems, conventional output drivers would need to increase the size of the output driving devices. However, this leads to excessive design footprint requirements for the circuit design, as well as leading to excessive power requirements.

Therefore, there is a need for an improved approach to implement output drivers for memory technologies. In particular, there is a need for an improved approach to implement output drivers for memory components that can handle both the higher levels of target speeds of advanced memory designs, as well as the requirement for lower supply voltages.

SUMMARY

In one or more embodiments of the present disclosure, a transmitter circuit is provided. The transmitter circuit may include a process, voltage, temperature (PVT) controlled pull-up pre-driver and a PVT controlled pull-up driver. The transmitter circuit may further include a PVT controlled pull-down pre-driver and a PVT controlled pull-down driver. The transmitter circuit may also include a thin oxide hybrid static switch operatively connected with the PVT controlled pull-up pre-driver and the PVT controlled pull-up driver. The transmitter circuit may further include a thin oxide NMOS static switch operatively connected with the PVT controlled pull-down pre-driver and the PVT controlled pull-down driver.

One or more of the following features may be included. The PVT controlled pull-up pre-driver and the PVT controlled pull-up driver and the PVT controlled pull-down pre-driver and the PVT controlled pull-down driver may each connected with a common node. The PVT controlled pull-up pre-driver and the PVT controlled pull-up driver may include a first NMOS pull-up driver calibration portion. The PVT controlled pull-up pre-driver and the PVT controlled pull-up driver may include a PMOS pull-up driver calibration portion located after the NMOS pull-up calibration portion. The transmitter circuit may further include a two-dimensional programmable transition boosting circuit operatively connected to the common node through a resistor. The transmitter circuit may further include a boost delay control circuit operatively connected with the two-dimensional programmable transition boosting circuit. The transmitter circuit may further include driver control logic operatively connected with the PVT controlled pull-up pre-driver and the PVT controlled pull-up driver and the PVT controlled pull-down pre-driver and the PVT controlled pull-down driver. The transmitter circuit may further include a resistor located between the common node and a PAD. The transmitter circuit may be included within an LPDDR6 device. All static controls may be located inside a driver slice.

In one or more embodiments of the present disclosure, a transmission method is provided. The method may include providing a PVT controlled pull-up pre-driver and a PVT controlled pull-up driver. The method may further include providing a PVT controlled pull-down pre-driver and a PVT controlled pull-down driver. The method may also include operatively connecting a thin oxide hybrid static switch with the PVT controlled pull-up pre-driver and the PVT controlled pull-up driver. The method may further include operatively connecting a thin oxide NMOS static switch with the PVT controlled pull-down pre-driver and the PVT controlled pull-down driver.

One or more of the following features may be included. The PVT controlled pull-up pre-driver and the PVT controlled pull-up driver and the PVT controlled pull-down pre-driver and the PVT controlled pull-down driver may each connected with a common node. The PVT controlled pull-up pre-driver and the PVT controlled pull-up driver may include a first NMOS pull-up driver calibration portion. The PVT controlled pull-up pre-driver and the PVT controlled pull-up driver may include a PMOS pull-up driver calibration portion located after the NMOS pull-up calibration portion. The method may further include operatively connecting a two-dimensional programmable transition boosting circuit with the common node through a resistor. The method may include operatively connecting a boost delay control circuit with the two-dimensional programmable transition boosting circuit. The method may further include operatively connecting driver control logic with the PVT controlled pull-up pre-driver and the PVT controlled pull-up driver and the PVT controlled pull-down pre-driver and the PVT controlled pull-down driver. The method may include providing a resistor between the common node and a PAD. The transmitter circuit may be included within an LPDDR6 device. All static controls may be located inside a driver slice.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Embodiments of the invention provide an improved architecture for an output driver that does not employ level shifters in the high speed data path. Since the proposed architecture is free from level shifters in the high speed data path, this provides better performance across PVT (process, temperature, voltage) corners. Since high speed data level shifter is not needed any further in the data path, there can be significant savings for design area and dynamic power.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration. For example, while the illustrative examples described below are described in the context of DRAM memory components, it is noted that the inventive concepts described herein are applicable to other types of memory technologies as well and are not to be limited only to DRAM applications unless explicitly claimed as such.

Figure 1:
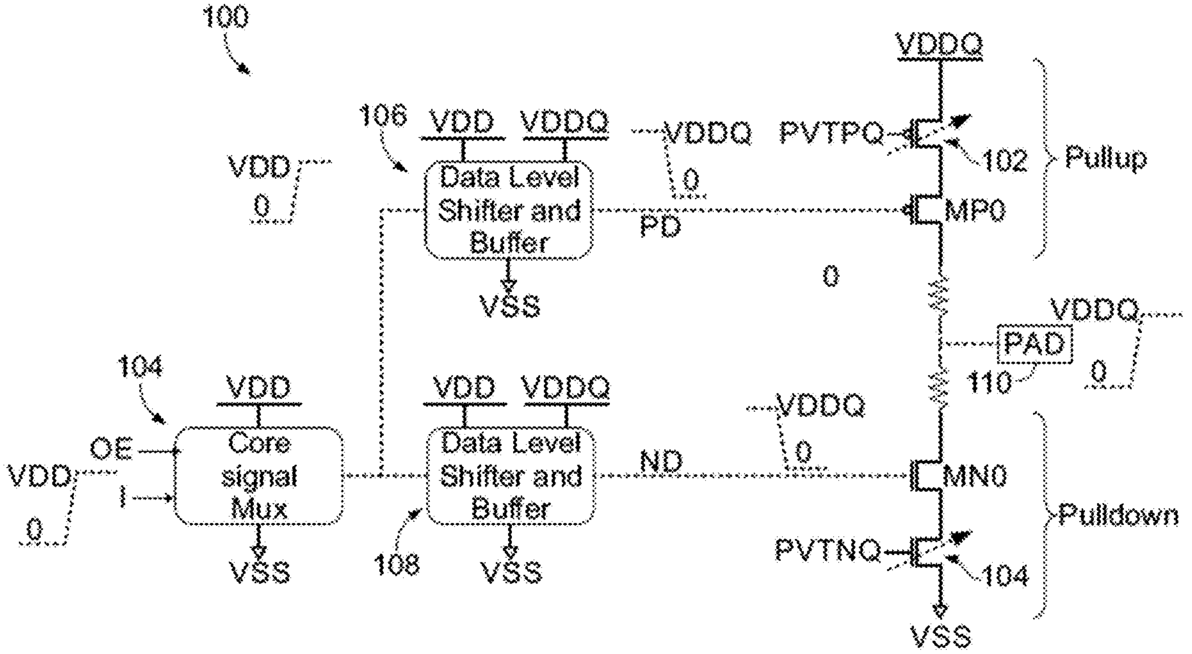
FIG. 1 illustrates an example output driver architecture.

Before describing embodiments of the invention, this disclosure will first discuss alternative output driver designs that are problematic and sub-optimal. FIG. 1 illustrates an example architecture 100 having a push-pull design for implementing a DRAM output driver. The top portion of the figure includes PMOS transistors to implement a "pullup" circuitry, while the bottom portion includes NMOS transistors to implement a "pulldown" circuitry.

The input signals are provided at the core signal mux 104 at a first voltage supply level VDD. One of the key functions of the output driver is to generate output signals at the VDDQ voltage level expected at the output pad 110. Therefore, the pullup portion includes a level shifter 106 to shift the signal level from VDD to VDDQ, while the pulldown path includes a similar level shifter 108. The pullup portion includes a variable transistor 102 to manage the impedance range of the output, given PVT variations that may exist in the electronic product. "PVTPQ" corresponds to PVT dependent signals that are applied to transistor 102 to control pull-up impedance across different PVT variations. The bottom portion of the figure similarly includes devices to implement the pulldown circuitry. For example, the pulldown portion includes a variable transistor 104 to manage the impedance range of the output for different PVT conditions by PVTNQ signals.

The approach shown in FIG. 1 suffers from certain problems, particularly where VDDQ is varying from 0.3V to 0.6V, e.g., where a high performance data level shifter is working up to 6.4 Ghz. To explain, consider the situation when the VDDQ supply voltage is at 0.3V at the same time the DRAM is being used for high-speed applications. For this architecture to work in this situation, VDDQ has to be higher than the threshold voltage of the transistor 102 to allow PMOS transistor 102 to turn on. If VDDQ (e.g., 0.3V) is less than the threshold voltage (e.g., 0.4V) of transistor 102, then transistor 102 will not turn on, and therefore this architecture cannot be used to implement DRAMs driver for this type of high-speed application.

In addition, since the VDDQ supply is near to the threshold voltage of the output driving devices (MN0 and MP0), this means that the output driver may show a large variation in its drive with respect to change in the PVT. Moreover, since the overdrive for MN0 and MP0 is very small, this creates challenges associated with ensuring the linearity of the output driver impedance with respect to the output voltage.

As a result, if the overdrive for MN0 and MP0 is very small, then the size needed for MN0 and MP0 is extremely large—especially when VDDQ is 0.3V. The large size of MN0 and MP0 shows high loading for the previous stages of the driver, and hence the effective area and power needed for the convention output driver architecture becomes extremely large.

Figure 2:
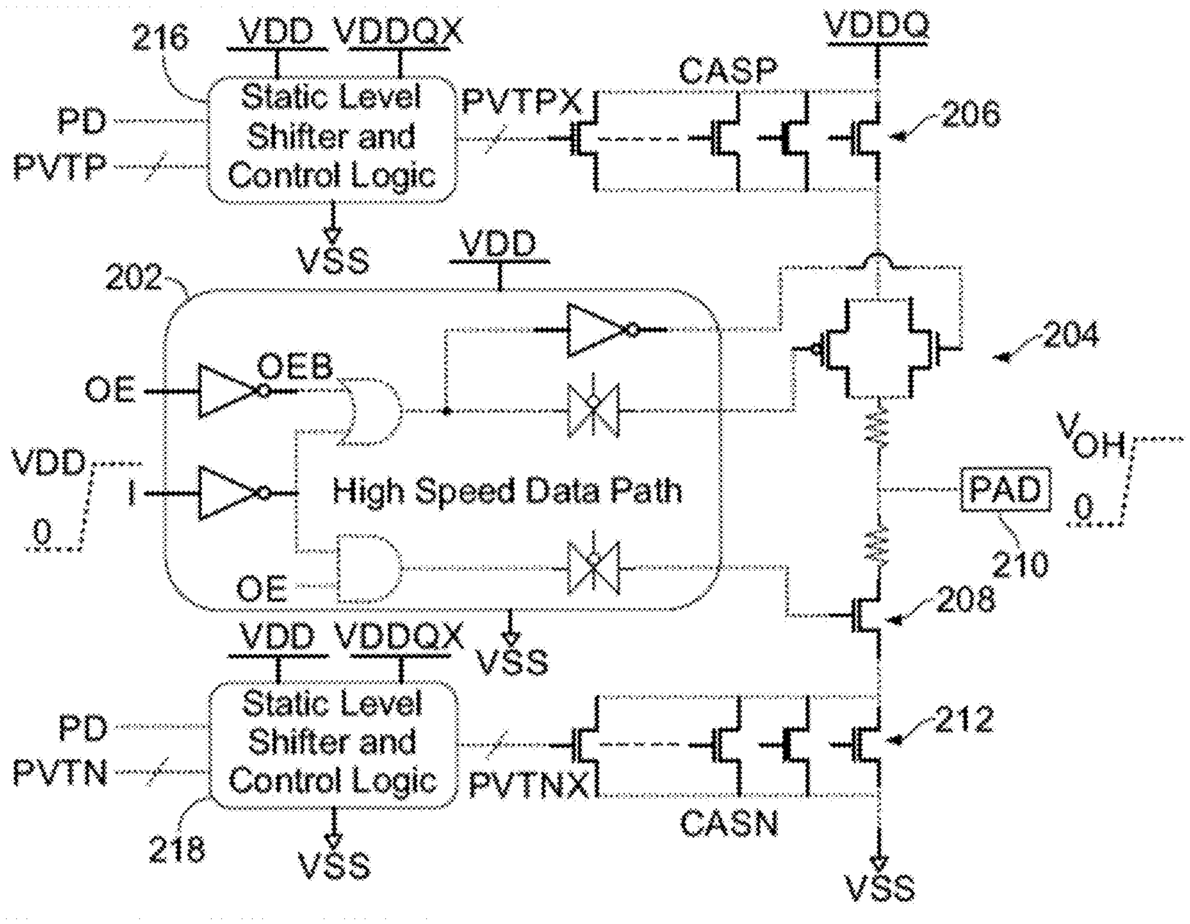
FIG. 2 provides an illustration of an improved architecture for implementing output drivers according to some embodiments of the invention.

FIG. 2 provides an illustration of an improved architecture for implementing output drivers according to some embodiments of the invention that solves these problems. This improved architecture removes the level shifter from the high speed data path. Instead, the high speed data path will only include a control/buffering architecture 202 to handle the incoming signals. The output driver is constructed by using a cascode combination of thin-gate devices 204 and thick-gate devices 206. The gate voltage of the thin-gate devices 204 are of core supply VDD level. The gate voltage of thick-gate devices 206 are of VDDQX level.

Devices 206 include a plurality of thick-oxide NMOS devices for pullup impedance control across different PVTs. A static level shifter 216 performs level shifting functionality from the VDD voltage level to a VDDQX voltage level. The additional supply VDDQX is provided which is at least one threshold voltage higher than the VDDQ supply. The use of the additional supply VDDQX reduces the size of thick-gate devices used in the driver significantly and hence it reduces the driver area. In some embodiments, as per JEDEC standard, the additional supply VDDQX can be used for LPDDR4X and LPDDR5 Memories.

The pullup path includes hybrid driver 204 having a design pull data path on the core supply voltage VDD to the main driver. The cascode thin-gate devices 204 in the pull driver are a parallel combination of NMOS and PMOS devices. The use of the parallel combination of thin-gate PMOS and NMOS in the pull-up path of driver makes the proposed architecture compatible for both LPDDR4X and LPDDR5 modes. In some embodiments, rather than using thick-oxide devices, the transistors within the hybrid driver 204 are implemented as thin-oxide ultra-low Vth devices. The use of ultra-low Vth devices makes the output pull-up impedance more linear across the full VDDQ range.

In the pulldown path, a thin-oxide device 208 is employed to drive the output. In addition, the pulldown portion of the architecture includes a "PVTN" signal that corresponds to the PVT dependent codes which are used to control the pull-down impedance across PVT with respect to the thick oxide NMOS devices 212. A static level shifter 218 performs level shifting functionality from the VDD voltage level to a VDDQX voltage level for PVTN codes.

The control/buffering architecture 202 includes various components to handle incoming signals along a high speed data path, to route signals as appropriate to the pullup or pulldown paths. As described in more detail below, the control/buffering architecture 202 includes components to implement buffering functionality, so that appropriate timing is achieved for input signals to reach corresponding destinations points within the circuit. This architecture is configured to implement the output driver for tri-state operations for a high impedance state, a "1" state, and a "0" state. This allows multiple circuits to share the same output line or lines. In addition, this permits operation for the device to be controlled by an "active low" input (output enable or "OE") which determines whether the output should be held in a high-impedance state or to drive the driver load at "1" or "0".

In operation, transistors 206 perform impedance control across different PVT conditions. The "PD" signal corresponds to the power down signal which will turn-off the output driver and reduce the power consumption. The "PVTP" signal corresponds to the PVT dependent codes which are used to control the pull-up impedance across PVT conditions. The VDD level PVTP signals are level shifted to VDDQX levels by using static level shifter 216. If the power down (PD) signal is turned on (logic high), then the control logic/static level shifters 216 and 218 will apply the appropriate control signal to the gates of the transistors 206 and 212 respectively to turn off these devices, thus turning off the supply voltage VDDQ to the output driver. If the PD signal is turned off (logic low), then the control logic/static level shifter 216 takes the PVTP signal and performs level shifting functionality to apply that PVTP signal (through signal PVTPX) to control the operation of the transistors 206 to control pullup impedance for any PVT variations that need to be addressed.

Notably, the control logic/static level shifter 216 and 218 performs level shifting functionality from the VDD voltage level to a VDDQX voltage level. The additional supply VDDQX is provided which is at least one threshold voltage higher than the VDDQ supply. In some embodiments, the VDDQX voltage is set at a fixed 1.2V or 1.1V fixed supply. The use of the additional supply VDDQX at these levels as the gate voltage for devices 206 allows VDDQ to be passed to the output driver devices while providing for a very large overdrive. This, in turn, allows the design to reduce the size of thick-gate devices used in the driver significantly and hence reduces the overall driver area.

Figure 3A:
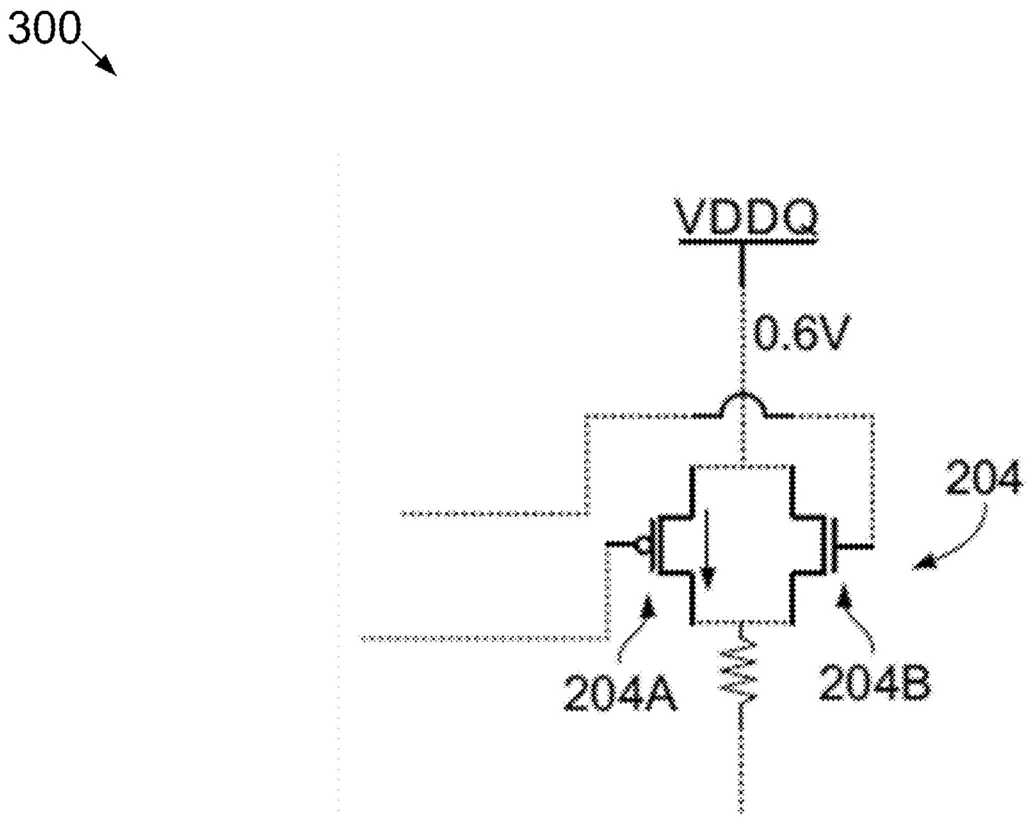
FIGS. 3A and 3B show an illustration of hybrid pull-up driver across wide VDDQ range.
Figure 3B:
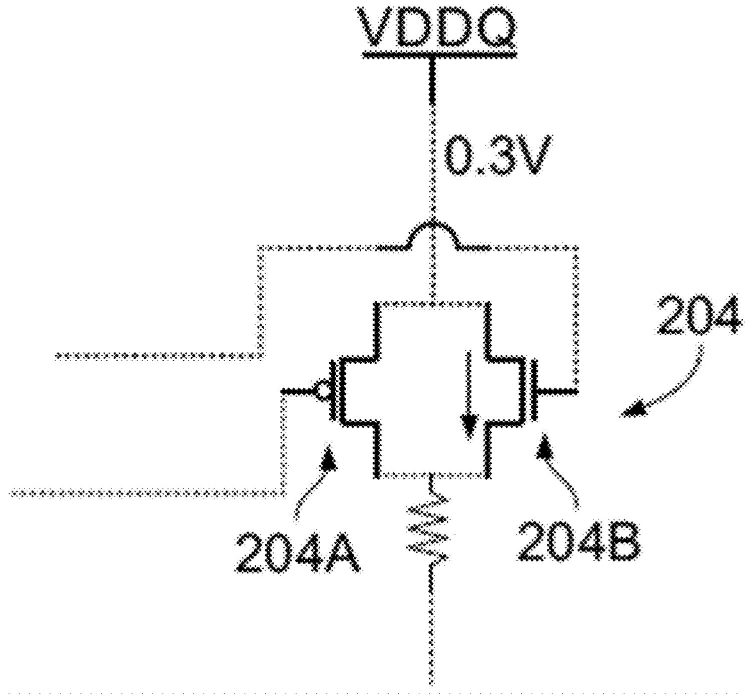

FIGS. 3A and 3B illustrate the operation of the parallel PMOS device 204A and NMOS device 204B within the hybrid pull-up driver 204. As previously noted, one of the issues with advanced memory designs pertains to possible changes/reductions for the DRAM supply voltages. For example, the target VDDQ supply for LPDDR4X DRAM ranges from 0.6V to 0.4V and the target VDDQ supply for LPDDR5 DRAM ranges from 0.5V to 0.3V. The present architecture is fully operational regardless of the exact supply voltage within the possible ranges, even for the smaller 0.3V level VDDQ supply voltages. As illustrated in FIG. 3A, if the VDDQ supply voltage is 0.6V and the PMOS device 204A has a threshold voltage of 0.3V, then the PMOS device 204A will turn on and pass the appropriate voltage level through the device. However, as shown in FIG. 3B, if the supply voltage goes down to 0.3V, and the threshold voltage of the PMOS device 204A is also 0.3V, then this device will not turn on. Instead, as shown in FIG. 3B, the NMOS device 204B will pass the voltage, since the gate voltage of this device is VDD level which is 0.75V.

It is noted that a similar hybrid driver design is not needed in the pulldown path. This is because the 0.75V of the VDD supply as applied to the gate of device 208 can easily pulldown the output voltage level to zero.

Figure 4A:
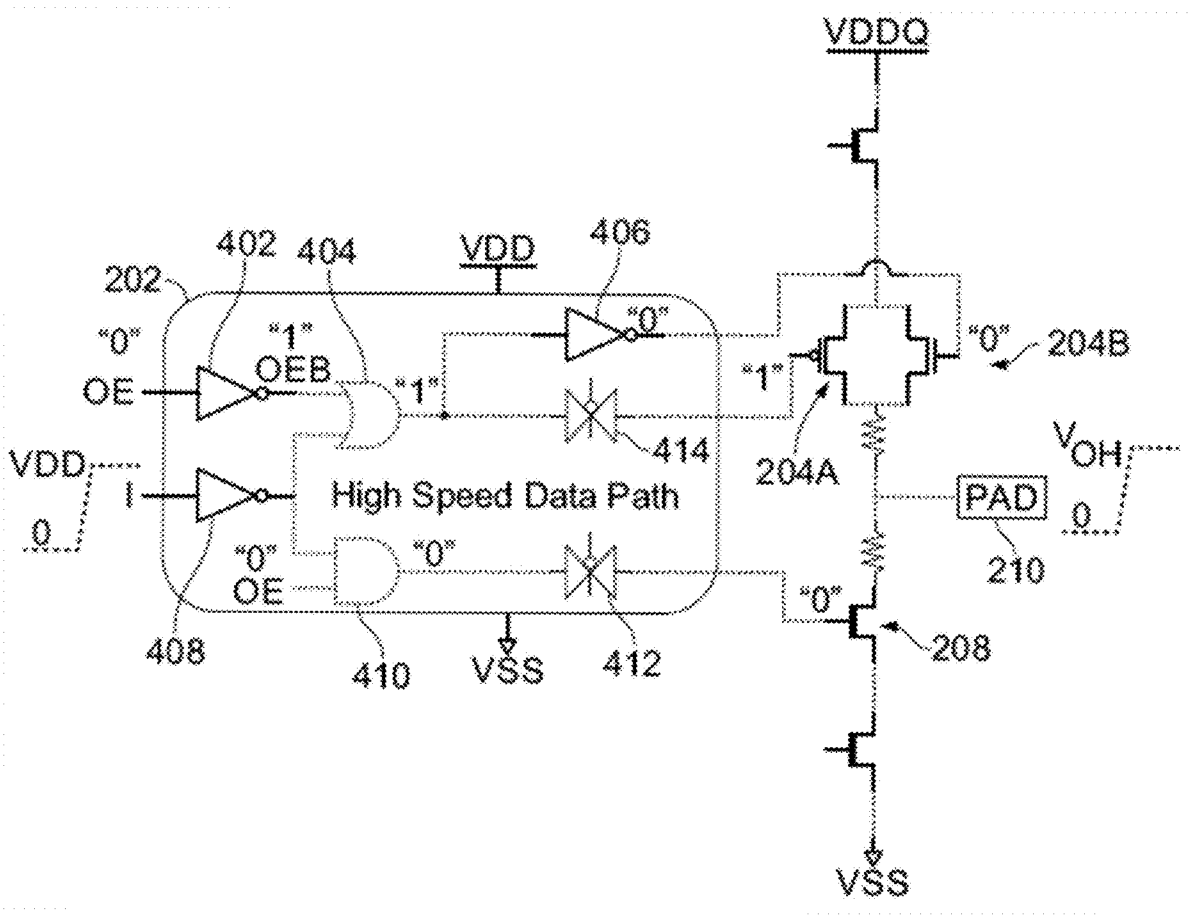
FIGS. 4A-C illustrate various operational aspects of the architecture of the FIG. 2.
Figure 4B:
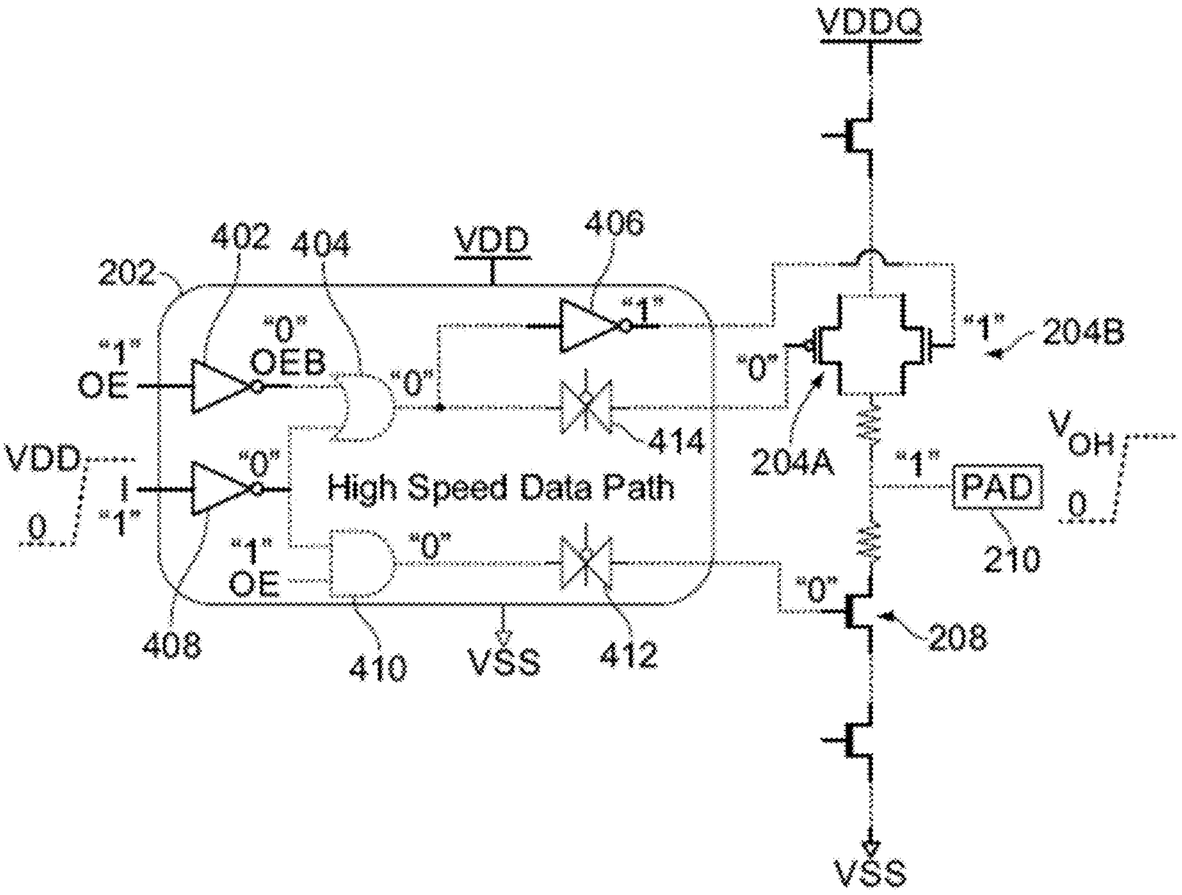
Figure 4C:
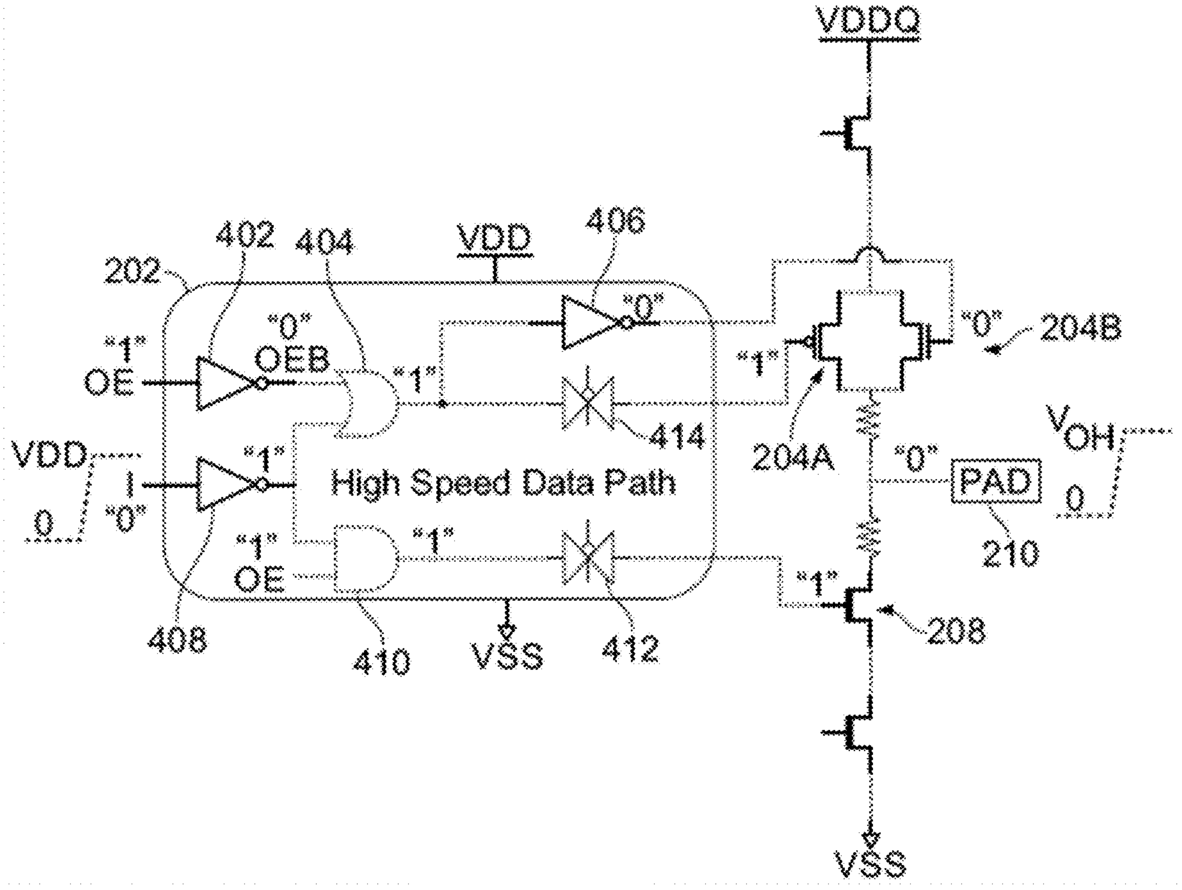

FIGS. 4A-4C illustrate the operation of the control/buffering architecture 202 to handle incoming signals along the high speed data path. The incoming signals include the "OE" and "I" signals. The "I" signal corresponds to the high frequency input signal from the core to the output driver, and extends from 0 to VDD (e.g., 0.75V). The "OE" signal is the output enable or disable signal for the output driver. In high speed applications, the operation to enable the output driver must be handled in a very quick manner. Therefore, the control logic for this signal is placed in the high speed data path to allow the driver to be quickly turned on.

In the tri-state operation of the output driver, FIG. 4A illustrates the output driver in the first state of not having its output enabled.

As shown in FIG. 4A, assume that the OE signal is set to "0" to disable transmission from the output driver. In the pullup path, the inverter 402 will output a "1" signal, which is fed to the input of gate 404. Regardless of the value of the other input to this gate, the output of gate 404 is also "1", which then follows two different paths to reach devices 204A and 204B. On the path to device 204B, the signal is applied to inverter 406 to generate a "0" signal, which is applied to the gate of device 204B, turning this device off. Along the other path to device 204A, the "1" signal passes through a transmission gate 414 to balance the signals along the different paths. The "1" signal is applied to the gate of device 204A, also turning this device off. Since both device 204A and 204B are off, this means that the pullup portion of the architecture is turned off.

In the pulldown path, the "0" OE signal is applied to the input of the AND gate 410, which results in an output "0"

from gate 410. This "0" signal is passed to transmission gate 412 on its way to the gate of device 208. The transmission gate 412 is employed to balance the signals along the different paths in the circuit. The "0" signal is applied to the gate of the device 208, turning this device off. Since device 208 is off, the pulldown portion of the architecture is turned off. In the tri-state operation of the output driver, FIG. 4B illustrates the output driver is in the second state of having the output enabled and the output being driven at the "1" level.

As shown in FIG. 4B, assume that the OE signal is set to "1" to enable transmission from the output driver, and the input signal "I" is also set to high (VDD high of 0.75V or logically "1"). The "1" value of the "I" signal is applied to the input of inverter 408, which generates a "0" at its output and is applied in the pullup path to the input of gate 404. The "1" value of the OE signal is applied to the input of the inverter 402, which outputs a "0" signal that is fed to the other input of gate 404. Therefore, since both inputs to gate 404 is "0", the output of gate 404 is "0", where this value then follows two different paths to reach devices 204A and 204B. On the path to device 204B, the signal is applied to inverter 406 to generate a "1" signal, which is applied to the gate of device 204B, turning this device on. Along the other path to device 204A, the "0" signal is applied to the gate of device 204A, turning this device on. Since both device 204A and 204B are on, the pullup portion of the architecture is turned on, passing the VDDQ voltage level (logically "1") to the Pad 210.

In the pulldown path, the "1" OE signal is applied to a first input of the AND gate 410. In addition, the "1" value of the "I" signal is applied to the input of inverter 408, which generates a "0" at its out and is applied in the pulldown path to the other input of gate 410. These inputs to gate 410 cause an output value of "0" to be output from gate 410. This "0" signal is passed to transmission gate 412 on its way to the gate of device 208. The "0" signal is applied to the gate of the device 208, turning this device off. Since device 208 is off, this means that the pulldown portion of the architecture is turned off.

In the tri-state operation of the output driver, FIG. 4C illustrates the output driver is in the third state of having the output enabled and the output being driven at the "0" level.

As shown in FIG. 4C, assume that the OE signal is set to "1" to enable transmission from the output driver, and the input signal "I" is set to "0". The "0" value of the "I" signal is applied to the input of inverter 408, which generates a "1" at its output and is applied in the pullup path to the input of gate 404. The "1" value of the OE signal is applied to the input of the inverter 402, which outputs a "0" signal that is fed to the other input of gate 404. Therefore, the output of gate 404 is "1". On the path to device 204B, the "1" signal is applied to inverter 406 to generate a "0" signal, which is applied to the gate of device 204B, turning this device off. Along the other path to device 204A, the "1" signal is applied to the gate of device 204A, also turning this device off. Since both device 204A and 204B are off, this means that the pullup portion of the architecture is turned off.

In the pulldown path, the "1" OE signal is applied to the input of the AND gate 410. The "0" value of the "I" signal is applied to the input of inverter 408, which generates a "1" at its output and is applied in the pulldown path to the other input of gate 410. Since both inputs to gate 410 are '1", this causes an output value of "1" to be output from gate 410. This "1" signal is passed to transmission gate 412 on its way to the gate of device 208. The "1" signal is applied to the gate of the device 208, turning this device on. Since device 208 is on, this means that the pulldown portion of the architecture is turned on, pulling the output value applied to pad 210 low to zero volts (logically "0").

This architecture therefore provides an improved approach to implement output drivers for memory components that can handle both the higher levels of target speeds of advanced memory designs, as well as the requirement for lower supply voltages. Since the proposed architecture is free from a level shifter in the high speed data path, it provides better performance across PVT corners. The full data path signaling is on the VDD supply and hence lesser data latency as propagation delay for Input (I) to output (PAD) is very small. Since the VDDQ supply is not used on the gate of any devices, this means that there is less variation in the output impedance across the full range of VDDQ supply ranging from 0.3V to 0.6V. Since the high speed data level shifter is not needed in the data path, significant savings can be obtained for electronic designs relative to area and dynamic power. Therefore, the present architecture can provide a power, performance and area (PPA) efficient high speed driver which can work at speed higher than 6.4 Gbps in the VDDQ range of 0.6V to 0.3V.

It is noted that in some embodiments, the VDDQX supply can be derived internally from VDD supply by using charge pump circuit. This is because in some embodiments, the VDDQX supply is used only in static paths, and therefore no dynamic power is needed from this supply.

Figure 5:
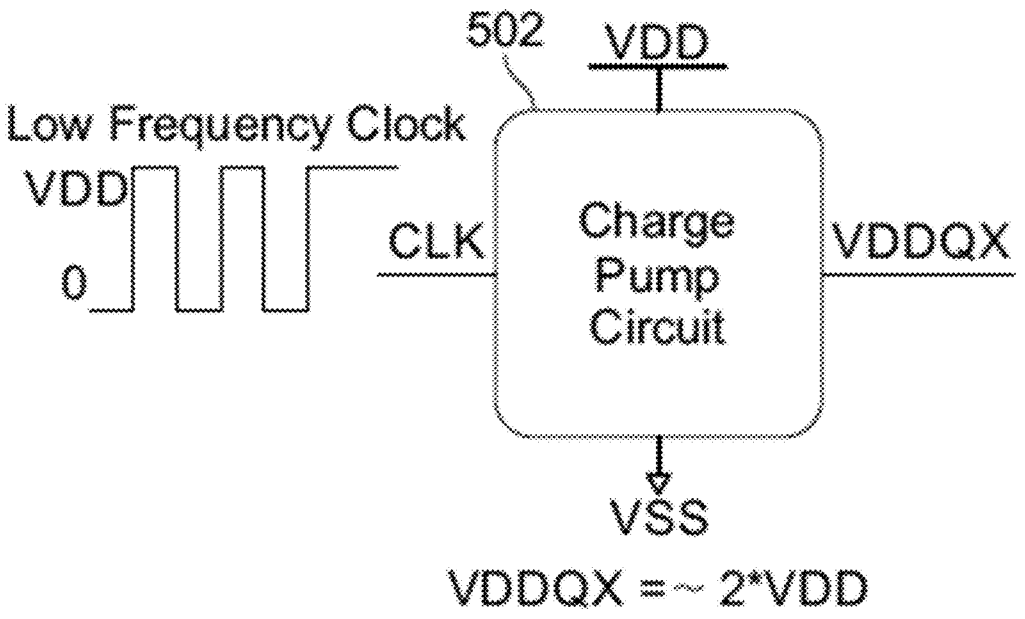
FIG. 5 shows an illustration of an approach whereby the VDDQX supply is derived from the VDD supply.

FIG. 5 shows an illustration of an approach whereby the VDDQX supply is derived from the VDD supply. In the approach shown in this figure, a charge pump circuit 502 is provided to derive the VDDQX supply. A charge pump is a converter mechanism that creates a higher (or lower) power source from an input power source. A low frequency clock is applied to an input of the charge pump circuit 502 to control its switching activity to generate the output VDDQX voltage level.

As is evident to one skilled in the art, other suitable approaches can also be taken to derive the VDDQX supply. For example, a voltage doubler circuit can also be used to generate the VDDQX supply by using the core voltage supply VDD.

As the technology is advancing, the need for high-speed DRAM is increasing. For example, the target speed for LPDDR6 DRAM is up to 14.4 Gbps. The Input/Output (IO) Interface supply (VDDQ) for DRAMs is getting reduced to save the dynamic power in the advance generations of DRAMs, for example. The target VDDQ supply for LPDDR6 DRAM is 0.5V to 0.3V. The recent advancement in Chiplet technology need Power Performance and Area (PPA) efficient high-speed interface to save the overall system level power consumption. The Transmitter and Receiver are the key power consuming element in the Chiplet interface and hence its need of the hour to explore new architectures of transmitter and receiver which can help in reducing the power consumption of High-speed low power interfaces. Therefore, the need arises to design Power, Performance and Area (PPA) efficient high-speed transmitter which can work at speed higher than 14.4 Gbps with the VDDQ supply ranging from 0.5V to 0.3V.

Figure 6:
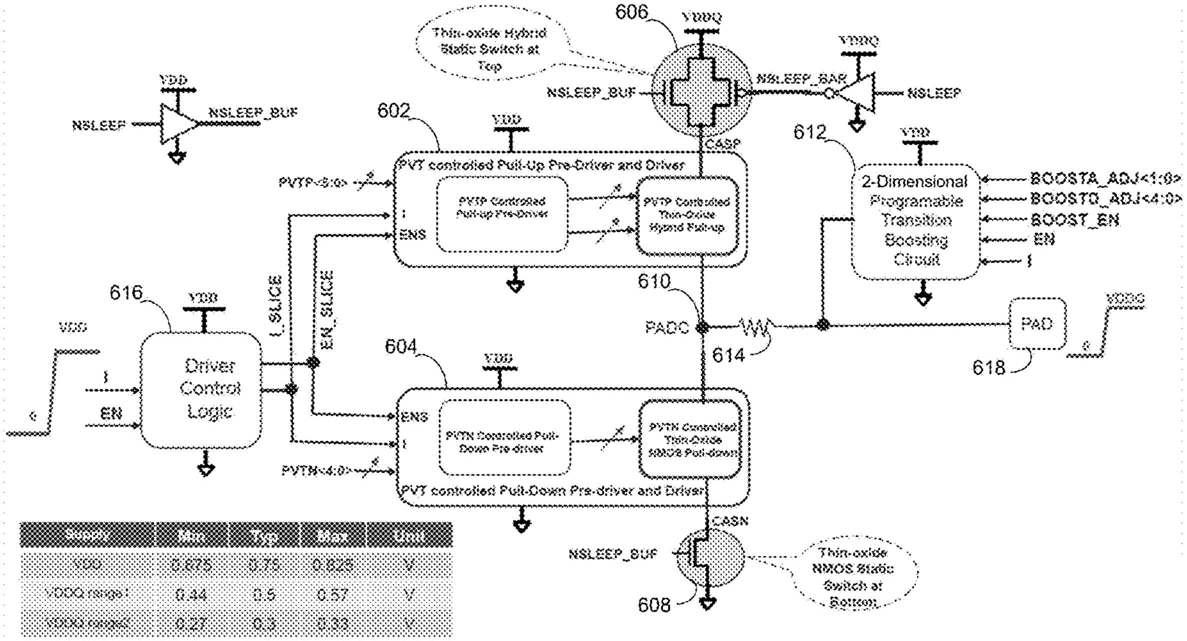
FIG. 6 shows an example transmitter circuit in accordance with embodiments of the present disclosure.

Referring now to FIGS. 6-9, embodiments of the present disclosure are directed towards a transmitter architecture. FIG. 6 shows an example transmitter circuit 600 in accordance with embodiments of the present disclosure. This particular architecture may include one or more switching devices connected on PAD and static cascade devices connected on Top and Bottom. This helps to reduce the number of PVT calibration bits needed for driver impedance calibration. This may also help to reduce the power consumption of transmitter.

In some embodiments, transmitter circuit 600 may include PVT controlled pull-up pre-driver and PVT controlled pull-up driver 602 and PVT controlled pull-down pre-driver and PVT controlled pull-down driver 604. Transmitter circuit 600 may further include thin oxide hybrid static switch 606 operatively connected with PVT controlled pull-up pre-driver and PVT controlled pull-up driver 602. Thin oxide NMOS static switch 608 may be operatively connected with PVT controlled pull-down pre-driver and PVT controlled pull-down driver 604. PVT controlled pull-up pre-driver and PVT controlled pull-up driver 602 and PVT controlled pull-down pre-driver and PVT controlled pull-down driver 604 may each connected to common node 610.

In some embodiments, transmitter circuit 600 may further include a two-dimensional programmable transition boosting circuit 612 operatively connected to the common node 610 through a resistor 614. Transmitter circuit 600 may further include driver control logic 616 operatively connected with PVT controlled pull-up pre-driver and PVT controlled pull-up driver 602 and PVT controlled pull-down pre-driver and PVT controlled pull-down driver 604. Resistor 614 may be located between common node 610 and PAD 618.

In operation, stacked switches 606 and 608 are located at the top of PVT controlled pull-up pre-driver and PVT controlled pull-up driver 602 and PVT controlled pull-down pre-driver and PVT controlled pull-down driver 604. Since stacked switches 606 and 608 are not connected directly with PAD 618, the size of stacked switches 606 and 608 may be increased without impacting the capacitance of PAD 618. Increasing the size of stacked switches 606 and 608 helps in reducing the number of PVT bits needed for driver impedance calibration.

In some embodiments, at fast PVT corner which is worst corner for power consumption, only a few PVT codes will be ON and most of the PVT codes will be OFF. The use of PVT control in the high-speed pre-driver data path helps in reducing the switching power as well as the peak switching current from VDD supply of the transmitter as most of the high-speed pre-driver will turn OFF at the fast PVT corner. The reduction in peak switching current may help in reducing the noise generated on VDD supply due to PDN. This helps in reducing the switching power of the transmitter as well as in reducing the peak switching current of transmitter.

As discussed above, in some embodiments the cascode static pull-up switch 606 may be located on top of the driver and the cascode static pull-down switch 608 may be located at the bottom of the driver. Since cascode static switches 606 and 608 are not directly connected to PAD 618 and hence the static switch sizes may be increased to reduce the static switch resistance value without impacting the PAD capacitance. Increasing the size of static switches 606 and 608 may reduce the static switch resistance R2 and R4, which may reduce the effective driver impedance variation across the PVT and hence may help in reducing the number of the PVTP and PVTN code needed to keep the driver impedance within the tolerance limit. This is shown in further detail hereinbelow.

The pull-up impedance of the proposed driver may be given as, $$R1 + R2 + R3 = Rpu$$

In one particular example, provided a transmitter architecture for a 240Ω driver slice, one example of pull-up resistance values from Resistor (R1), the cascode static switch resistance (R2) and PVTP controlled switch resistance (R3) at typical PVT corner:

$$R1 = 120\ \Omega$$

$$R2 = 10\ \Omega$$

$$R3\_typ = 240\ \Omega - 120\ \Omega - 10\ \Omega = 110\ \Omega$$

In a CMOS process, the resistance value of active devices may vary ~+/−40% and the resistance value of high precision resistor varies ~+/−20%. Based on above, the minimum and maximum resistance value of a PVTP controlled switch in some embodiments may be given by:

$$\begin{matrix} R3\_min = 240\ \Omega - 1.2*120\ \Omega - 1.4*10\ \Omega = 82\ \Omega \\ R3\_max = 240\ \Omega - 0.8*120\ \Omega = 0.6*10\ \Omega = 138\ \Omega \end{matrix} \Rightarrow \frac{R3\_max}{R3\_min} = \frac{138}{82} = 1.7$$

Assuming the driver impedance tolerance limit is 10%, the number of steps needed for driver calibration is ≈1.7/0.1=17, which eventually results a 5-bit binary waited PVTP and PVTN calibration code. In some embodiments, the minimum needed resistance from a PVT controlled switch is 82Ω, which is more than the 60Ω needed in existing technologies and hence the effective size of the PVT controlled switches connected on the PAD may be reduced, which may result in the reduction in the effective PAD capacitance. The reduction in PVT controlled switch device sizes may result in a reduction in the pre-driver size and hence may cause a reduction in the switching power of the transmitter architectures discussed herein. The reduction in the number of PVTP and PVTN codes may reduce the number of pre-drivers and hence may reduce the switching power of the transmitter.

In operation, first PVTP controlled NMOS pull-up switches may turn ON and once all the NMOS switches are ON, the PVTP controlled PMOS pull-up switches may turn ON. This may reduce the amount of pre-driver switching at the worst PVT corner for power and hence the effective switching power of the transmitter on the worst PVT corner for power will reduce. In some embodiments, the first NMOS pull-up switches may turn ON and once all NMOS switches turn ON, the PMOS pull-up switches may turn ON and hence the pull-up impedance may be dominated by the NMOS pull-up devices, which makes the pull-up driver less sensitive to VDDQ noise. This helps in reducing the supply noise induced jitter in some implementations.

Figure 7:
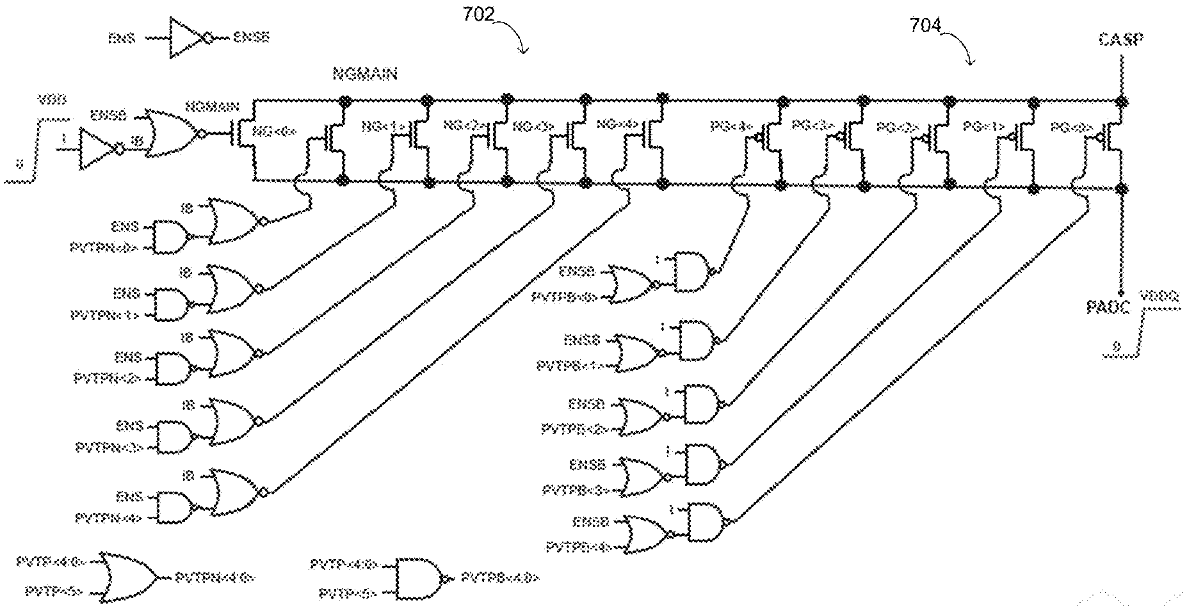
FIG. 7 shows an example PVT controlled pull-up pre-driver and driver circuit in accordance with embodiments of the present disclosure.

Referring now to FIG. 7, an example PVT controlled pull-up pre-driver and driver circuit 700 is provided. Circuit 700 may include first NMOS pull-up driver calibration portion 702. Circuit 700 may further include a PMOS pull-up driver calibration portion 704 located after the NMOS pull-up calibration portion 702. This hybrid architecture may help to reduce the VDDQ noise sensitivity of the driver. This may also help in reducing the LSB step size of calibrated driver, which may reduce the calibrated driver impedance error. The hybrid architecture may be configured to make the pull-up driver impedance NMOS dominated and hence the impact of VDDQ noise at the PAD transition may also reduce as VDDQ noise may not see any amplification which may occur in PMOS dominated pull-up driver. All static controls may be located inside a driver slice to reduce the number of switching stages in a high-speed data path. This helps in reducing the number of switching stages in high-speed data path which makes the high-speed data path less sensitive to VDD noise. This may also help in reducing the effective power consumption of the transmitter.

Figure 8:
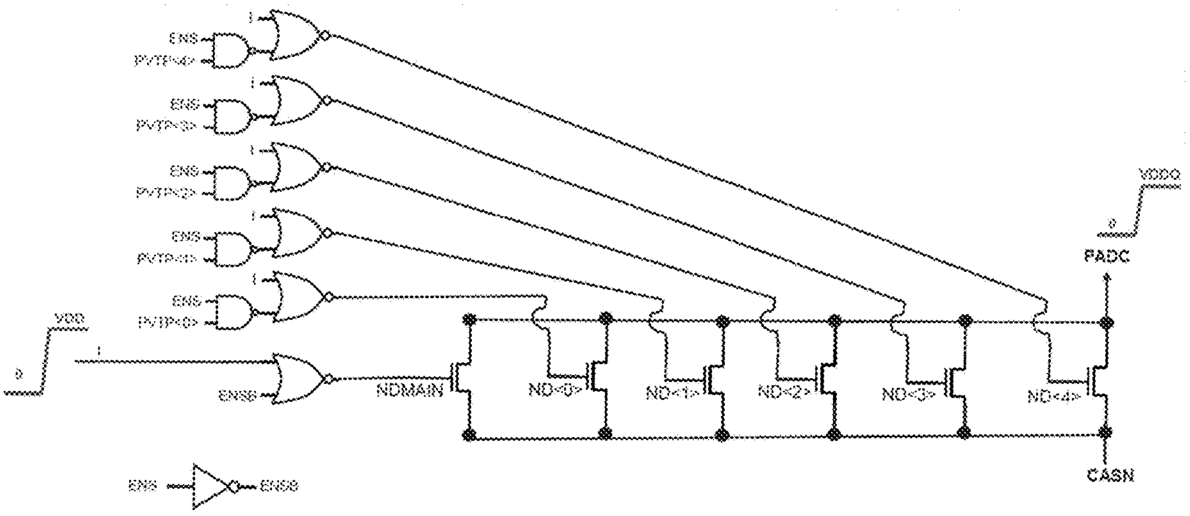
FIG. 8 shows an example PVT controlled pull-down pre-driver and driver circuit in accordance with embodiments of the present disclosure.

Referring now to FIG. 8, an example PVT controlled pull-down pre-driver and driver circuit 800 is provided. In contrast, with the hybrid calibration depicted in FIG. 7, PVT controlled pull-down pre-driver and driver circuit 800 may include NMOS calibration portion as is depicted in FIG. 8.

Figure 9:
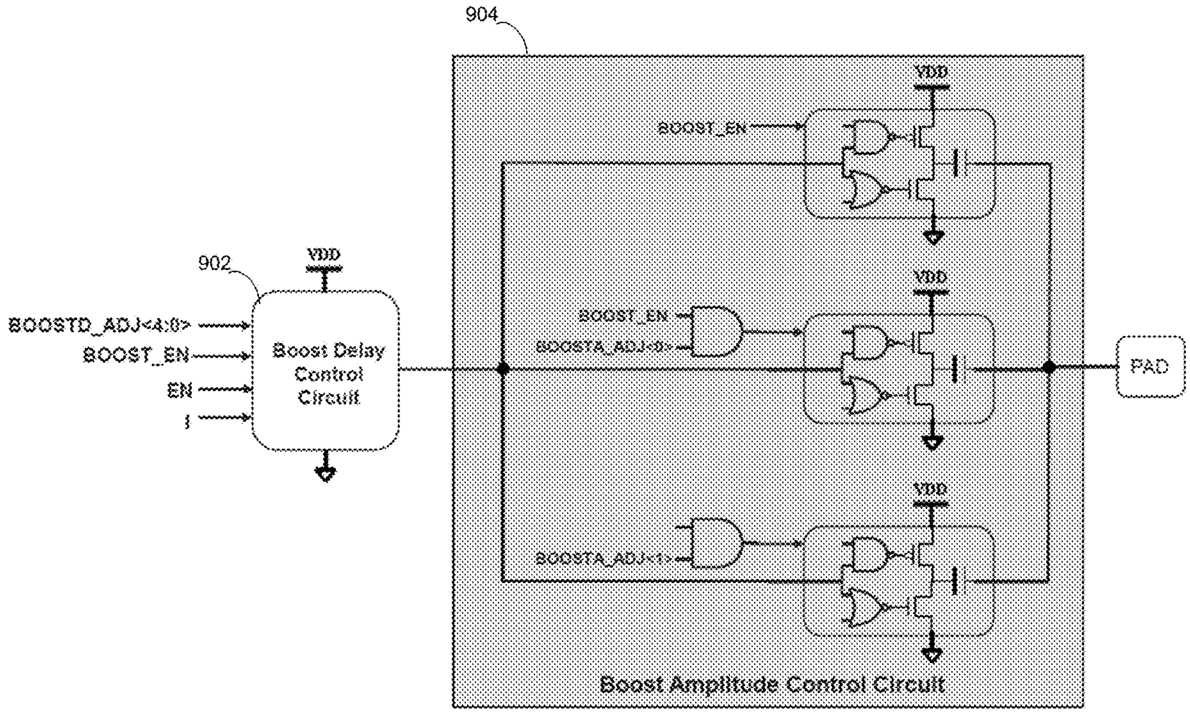
FIG. 9 shows an example two-dimensional programmable transition boosting circuit in accordance with embodiments of the present disclosure.

Referring now to FIG. 9, an example two-dimensional programmable transition boosting circuit 900 is provided. Boosting circuit 900 may include a boost delay control circuit 902 operatively connected with the two-dimensional programmable transition boosting circuit 904. In operation, this architecture may be configured to provide flexibility to adjust the firing delay of the boost circuit as well as the strength of the boost circuit, which allows for optimization as per different channel need.

Embodiments of the present disclosure provide numerous advantages over existing approaches. The circuits and architectures included herein provide a power, performance and area efficient transmitter architecture for LPDDR6 DRAM memory interface and other high speed low power interfaces.

It will be apparent to those skilled in the art that various modifications and variations may be made in embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A transmission method comprising:

providing a process, voltage, temperature (PVT) controlled pull-up pre-driver and a process, voltage, temperature (PVT) controlled pull-up driver;

providing a process, voltage, temperature (PVT) controlled pull-down pre-driver and a process, voltage, temperature (PVT) controlled pull-down driver;

operatively connecting a thin oxide hybrid static switch with the PVT controlled pull-up pre-driver and the PVT controlled pull-up driver; and operatively connecting a thin oxide NMOS static switch with the PVT controlled pull-down pre-driver and the PVT controlled pull-down driver wherein the PVT controlled pull-up pre-driver and the PVT controlled pull-up driver includes a first NMOS pull-up driver calibration portion, which is calibrated first; and wherein the PVT controlled pull-up pre-driver and the PVT controlled pull-up driver includes a PMOS pull-up driver calibration portion located after the NMOS pull-up calibration portion, which is calibrated after NMOS pull-up calibration code is saturated.

2. The transmission method of claim 1, wherein the PVT controlled pull-up pre-driver and the PVT controlled pull-up driver and the PVT controlled pull-down pre-driver and the PVT controlled pull-down driver are each connected with a common node.

3. The transmission method of claim 2, further comprising:

operatively connecting a two-dimensional programmable transition boosting circuit with the common node through a resistor.

4. The transmission method of claim 3, further comprising:

operatively connecting a boost delay control circuit with the two-dimensional programmable transition boosting circuit.

5. The transmission method of claim 2, further comprising:

operatively connecting driver control logic with the PVT controlled pull-up pre-driver and the PVT controlled pull-up driver and the PVT controlled pull-down pre-driver and the PVT controlled pull-down driver.

6. The transmission method of claim 2, further comprising:

providing a resistor between the common node and a PAD.

7. The transmission method of claim 1, wherein the transmitter circuit is included within an LPDDR6 device interface.

8. The transmission method of claim 1, wherein all static controls are located inside a driver slice.

9. A transmitter circuit comprising:

a process, voltage, temperature (PVT) controlled pull-up pre-driver and a process, voltage, temperature (PVT) controlled pull-up driver;

a process, voltage, temperature (PVT) controlled pull-down pre-driver and a process, voltage, temperature (PVT) controlled pull-down driver;

a thin oxide hybrid static switch operatively connected with the PVT controlled pull-up pre-driver and the PVT controlled pull-up driver; and a thin oxide NMOS static switch operatively connected with the PVT controlled pull-down pre-driver and the PVT controlled pull-down driver wherein the PVT controlled pull-up pre-driver and the PVT controlled pull-up driver includes a first NMOS pull-up driver calibration portion, which is calibrated first; and wherein the PVT controlled pull-up pre-driver and the PVT controlled pull-up driver includes a PMOS pull-up driver calibration portion located after the NMOS pull-up calibration portion, which is calibrated after an NMOS pull-up calibration code is saturated.

10. The circuit of claim 9, wherein the PVT controlled pull-up pre-driver and the PVT controlled pull-up driver and the PVT controlled pull-down pre-driver and the PVT controlled pull-down driver are each connected with a common node.

11. The circuit of claim 10, further comprising:

a two-dimensional programmable transition boosting circuit operatively connected to the common node.

12. The circuit of claim 11, further comprising:

a boost delay control circuit operatively connected with the two-dimensional programmable transition boosting circuit.

13. The circuit of claim 10, further comprising:

driver control logic operatively connected with the PVT controlled pull-up pre-driver and the PVT controlled pull-up driver and the PVT controlled pull-down pre-driver and the PVT controlled pull-down driver.

14. The circuit of claim 10, further comprising:

a resistor located between the common node and a PAD.

15. The circuit of claim 9, wherein the transmitter circuit is included within an LPDDR6 device interface.

16. The circuit of claim 9, wherein all static controls are located inside a driver slice.

* * * * *